(12) United States Patent
O'Toole et al.

(10) Patent No.: US 6,492,192 B1
(45) Date of Patent: Dec. 10, 2002

(54) METHOD OF MAKING A SCHOTTKY DIODE IN AN INTEGRATED CIRCUIT

(75) Inventors: James E. O'Toole, Boise, ID (US); John R. Tuttle, Boise, ID (US); Mark E. Tuttle, Boise, ID (US); Tyler Lowrey, Boise, ID (US); Kevin M. Devereaux, Boise, ID (US); George E. Pax, Boise, ID (US); Brian P. Higgins, Boise, ID (US); David K. Ovard, Meridian, ID (US); Shu-Sun Yu, Boise, ID (US); Robert R. Rotzoll, Chipita Park, CO (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/151,936

(22) Filed: Sep. 11, 1998

Related U.S. Application Data

(62) Division of application No. 08/705,043, filed on Aug. 29, 1996, now Pat. No. 6,130,602
(60) Provisional application No. 60/017,900, filed on May 13, 1996.

(51) Int. Cl.⁷ .............................................. H01L 21/00
(52) U.S. Cl. .............................................. 438/57; 438/73
(58) Field of Search .................... 438/328, 257, 438/FOR 415, FOR 335, 73, 80, 81, 57, 381; 257/44

(56) References Cited

U.S. PATENT DOCUMENTS

| | | | |
|---|---|---|---|
| 3,299,424 A | 1/1967 | Vinding | |
| 3,852,755 A | 12/1974 | Works et al. | |
| 3,924,320 A | * 12/1975 | Altman et al. | 438/570 |
| 4,075,632 A | 2/1978 | Baldwin et al. | |
| 4,190,838 A | 2/1980 | Kemp | 343/18 |
| 4,384,288 A | 5/1983 | Waltpn | 340/825.34 |
| 4,478,881 A | * 10/1984 | Bartur et al. | 438/582 |
| 4,514,731 A | 4/1985 | Falck et al. | 340/825.08 |
| 4,572,976 A | 2/1986 | Fockens | 307/524 |
| 4,656,463 A | 4/1987 | Anders et al. | 340/572 |
| 4,700,179 A | 10/1987 | Fancher | |
| 4,724,427 A | 2/1988 | Carroll | 340/572 |
| 4,743,864 A | 5/1988 | Nakagawa et al. | |
| 4,746,830 A | 5/1988 | Holland | |

(List continued on next page.)

FOREIGN PATENT DOCUMENTS

| | | |
|---|---|---|
| DE | 3212876 A1 | 4/1983 |
| EP | 0 172 445 A1 | 7/1985 |
| EP | 0 616 429 A1 | 1/1994 |
| EP | 0 682 382 A2 | 4/1995 |
| EP | 0 682 382 A3 | 5/1995 |

OTHER PUBLICATIONS

Muller & Kamins, Device Electronics for Integrated Circuits, 1977, John Wiley & Sons, 2nd Edition, pp. 157–160.*
Fink & Christiansen, Electronics Engineer's Handbook, 1989, McGraw–Hill Book Company, 3rd Edtion, pp. 7–41 to 7–42, 8–38 to 8–39, and 9–66 to 9–69.*

(List continued on next page.)

Primary Examiner—Michael Sherry
Assistant Examiner—Evan Pert
(74) Attorney, Agent, or Firm—Wells St. John P. S.

(57) ABSTRACT

A method of forming an integrated circuit including a Schottky diode includes providing a substrate of a first conductivity type, defining a region of a second conductivity type relative to the substrate and forming an insulator over the second conductivity type region. The method also includes removing an area of the insulator for definition of a contact hole, and removing an area encircling the contact hole and forming highly doped regions of the second conductivity type in second conductivity type regions encircling the contact hole. The method further includes depositing a Schottky metal in the contact hole and annealing the metal to form a suicide interface to the second conductivity type region.

25 Claims, 15 Drawing Sheets

Microfiche Appendix Included
(5 Microfiche, 266 Pages)

U.S. PATENT DOCUMENTS

| Patent | Date | Inventor |
|---|---|---|
| 4,783,646 A | 11/1988 | Matsuzaki ................... 340/572 |
| 4,786,903 A | 11/1988 | Grindahl et al. |
| 4,800,543 A | 1/1989 | Lyndon-James et al. |
| 4,816,839 A | 3/1989 | Landt |
| 4,827,395 A | 5/1989 | Anders et al. |
| 4,853,705 A | 8/1989 | Landt |
| 4,854,328 A | 8/1989 | Pollack ........................ 128/736 |
| 4,857,893 A | 8/1989 | Carroll ........................ 340/572 |
| 4,862,160 A | 8/1989 | Ekchian et al. ........ 340/825.54 |
| 4,868,908 A | 9/1989 | Pless et al. .................. 323/267 |
| 4,870,419 A | 9/1989 | Baldwin et al. .............. 342/50 |
| 4,888,591 A | 12/1989 | Landt et al. ................... 342/44 |
| 4,890,072 A | 12/1989 | Espe et al. ..................... 331/11 |
| 4,912,471 A | 3/1990 | Tyburski et al. .............. 342/42 |
| 4,926,182 A | 5/1990 | Ohta et al. |
| 4,952,889 A | 8/1990 | Irwin et al. |
| 5,030,807 A | 7/1991 | Landt et al. |
| 5,072,194 A | 12/1991 | Chevallier ................... 330/260 |
| 5,075,691 A | 12/1991 | Garay et al. |
| 5,081,458 A | 1/1992 | Meunier |
| 5,086,389 A | 2/1992 | Hassett et al. ............... 364/401 |
| 5,103,156 A | 4/1992 | Jones et al. ................... 320/35 |
| 5,122,687 A | 6/1992 | Schmidt |
| 5,128,938 A | 7/1992 | Borras |
| 5,130,668 A | 7/1992 | Emslie et al. |
| 5,134,085 A | 7/1992 | Gilgen et al. ................. 437/52 |
| 5,142,292 A | 8/1992 | Chang |
| 5,143,820 A * | 9/1992 | Kotecha et al. ............. 430/314 |
| 5,144,314 A | 9/1992 | Malmberg et al. ............ 342/44 |
| 5,151,624 A | 9/1992 | Stegherr et al. |
| 5,153,583 A | 10/1992 | Murdoch |
| 5,164,985 A | 11/1992 | Nysen et al. ................... 380/9 |
| 5,175,774 A | 12/1992 | Truax et al. ................... 382/8 |
| 5,191,295 A | 3/1993 | Necoechea .................. 328/155 |
| 5,206,609 A | 4/1993 | Mijuskovic |
| 5,218,343 A | 6/1993 | Stobbe et al. |
| 5,231,273 A | 7/1993 | Caswel |
| 5,252,979 A | 10/1993 | Nysen |
| 5,272,367 A | 12/1993 | Dennison et al. ........... 257/306 |
| 5,281,927 A | 1/1994 | Parker ........................ 331/1 A |
| 5,287,112 A | 2/1994 | Schuermann ................ 342/42 |
| 5,294,928 A | 3/1994 | Cooper et al. |
| 5,300,875 A | 4/1994 | Tuttle ........................... 320/20 |
| 5,300,896 A | 4/1994 | Suesserman ................ 330/260 |
| 5,311,186 A | 5/1994 | Utsu et al. |
| 5,323,150 A | 6/1994 | Tuttle ..................... 340/825.54 |
| 5,340,968 A | 8/1994 | Watanabe et al. |
| 5,355,513 A | 10/1994 | Clarke et al. |
| 5,361,403 A | 11/1994 | Dent ............................. 455/74 |
| 5,365,192 A | 11/1994 | Wagner et al. .............. 330/252 |
| 5,365,551 A | 11/1994 | Snodgrass et al. ............. 375/1 |
| 5,374,930 A | 12/1994 | Schuermann ................ 342/42 |
| 5,394,159 A | 2/1995 | Schneider et al. .......... 343/700 |
| 5,394,444 A | 2/1995 | Silvey et al. |
| 5,406,263 A | 4/1995 | Tuttle ........................ 340/572 |
| 5,406,297 A | 4/1995 | Caswell et al. ............. 343/741 |
| 5,412,351 A | 5/1995 | Nystrom et al. |
| 5,412,665 A | 5/1995 | Gruodis et al. |
| 5,416,434 A | 5/1995 | Kootstra et al. |
| 5,420,757 A | 5/1995 | Eberhardt et al. .......... 361/813 |
| 5,423,074 A | 6/1995 | Dent ............................. 455/74 |
| 5,430,441 A | 7/1995 | Bickley et al. |
| 5,444,223 A | 8/1995 | Blama |
| 5,446,761 A | 8/1995 | Nag et al. |
| 5,448,110 A | 9/1995 | Tuttle et al. |
| 5,448,242 A | 9/1995 | Sharpe et al. ................. 342/42 |
| 5,448,772 A | 9/1995 | Grandfield |
| 5,450,087 A | 9/1995 | Hurta et al. |
| 5,461,385 A | 10/1995 | Armstrong ................... 342/42 |
| 5,471,212 A | 11/1995 | Sharpe et al. ................. 342/51 |
| 5,478,991 A | 12/1995 | Watanabe et al. |
| 5,485,520 A | 1/1996 | Chaum et al. ................. 380/24 |
| 5,489,546 A | 2/1996 | Ahmad et al. ................ 437/57 |
| 5,499,214 A | 3/1996 | Mori et al. |
| 5,500,650 A | 3/1996 | Snodgrass et al. ............ 342/42 |
| 5,511,090 A | 4/1996 | Denton et al. .............. 375/205 |
| 5,525,992 A | 6/1996 | Froschermeier |
| 5,541,583 A | 7/1996 | Mandelbaum |
| 5,541,585 A | 7/1996 | Duhame et al. |
| 5,568,512 A | 10/1996 | Rotzoll |
| 5,576,647 A | 11/1996 | Sutardja et al. ............. 327/108 |
| 5,606,323 A | 2/1997 | Heinrich et al. |
| 5,621,412 A | 4/1997 | Sharpe et al. |
| 5,623,224 A | 4/1997 | Yamada et al. |
| 5,640,151 A | 6/1997 | Reos et al. ............ 340/825.54 |
| 5,649,296 A | 7/1997 | MacLellan et al. |
| 5,657,359 A | 8/1997 | Sakae et al. |
| 5,677,667 A | 10/1997 | Lesesky et al. |
| 5,686,864 A | 11/1997 | Martin et al. |
| 5,686,920 A | 11/1997 | Hurta et al. |
| 5,703,509 A | 12/1997 | Hirata |
| 5,719,550 A | 2/1998 | Bloch et al. |
| 5,721,678 A | 2/1998 | Widl |
| 5,721,783 A | 2/1998 | Anderson |
| 5,726,630 A | 3/1998 | Marsh et al. |
| 5,774,022 A | 6/1998 | Griffin et al. ................ 331/1 A |
| 5,780,916 A * | 7/1998 | Berger et al. ................ 257/471 |
| 5,815,042 A | 9/1998 | Chow et al. |
| 5,901,349 A | 5/1999 | Guegnaud et al. |
| 5,907,789 A * | 5/1999 | Komatsu ..................... 438/649 |

OTHER PUBLICATIONS

Fink & Christiansen, Electronic Engineer's Handbook, 3$^{rd}$ Edition, McGraw–Hill, 1989, pp. 8–22, 8–23 and 8–40.*

Wolf, Silicon Processing for the VLSI ERA vol. 2: Process Integration, 1986, Lattice Press, pp. 65 and 195.*

*Analysis and Design of Analog Integrated Circuits,* Paul R. Gray & Robert G. Meyer, pp. 667–681, 1993.

*Analog Integrated Circuits for Communication (Principles, Simulation and Design)*, Donald O. Pederson & Kartikeya Mayaram, pp. 431–433, 1991.

*A Precise Four–Quadrant Multiplier With Subnanosecond Response,* B. Gilbert, IEEE Journal of Solid State Circuits, pp. 365–373, 1968.

N.J. Woods et al., "One micrometre scale slef–aligned cobalt disilicide Schottky barrier diodes", Electronics Letters, IEE Stevenage, GB, vol. 31, No. 21, Oct. 1995, pp. 1878–1880.

Shenai Krishna, "Characteristics of LPCVD WS12/N–SI Schottky Contacts", IEEE Electron Device Letters, US, IEEE Inc. N.Y., vol. 12 No. 4, Apr. 1991, pp. 169–171.

E.C. Young, "The Penguin Dictionary of Electronics", 1988, Marker House Books, pp. 7 and 124.

Raymond W. Waugh, "Designing Detectors for RF/ID Tags," Proceedings of RF West, 1995, 13 pages.

"*CMOS Analog Integrated Circuits Based on Weak Inversion Operation*", by Eric Vittoz and Jean Fellrath, IEEE Journal of Solid State Circuits, vol. SC–12, No. 3, Jun. 1977.

Mitsubishi Motors Corporation Web Page, 1995.

"*Digital RF/ID Enhances GPS*", by John R. Tuttle, Proceedings of the Second Annual Wireless Symposium, pp. 406–411, Feb. 15–18, 1994, Santa Clara, CA.

"*Micron Morning Report*", The Idaho Statesman, Jul. 16, 1993.

"*A Low–Power Spread Spectrum CMOS RFIC for Radio Identification Applications*", by John R. Tuttle, Conference Proceedings from RF Expo West, pp. 216–222, Mar. 22–24, 1994, San Jose, CA.

Provisional application, Ser. No. 60/023,321, filed Jul. 30, 1996.
Provisional Application, Ser. No. 60/023,318, filed Jul. 30, 1996.

"Micron RFID Communications Protocol Manual," Jul. 22, 1993, Pre–Release Version 0.95, pp. 1–71.

* cited by examiner

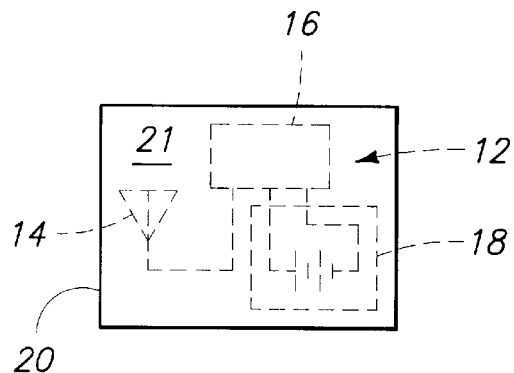
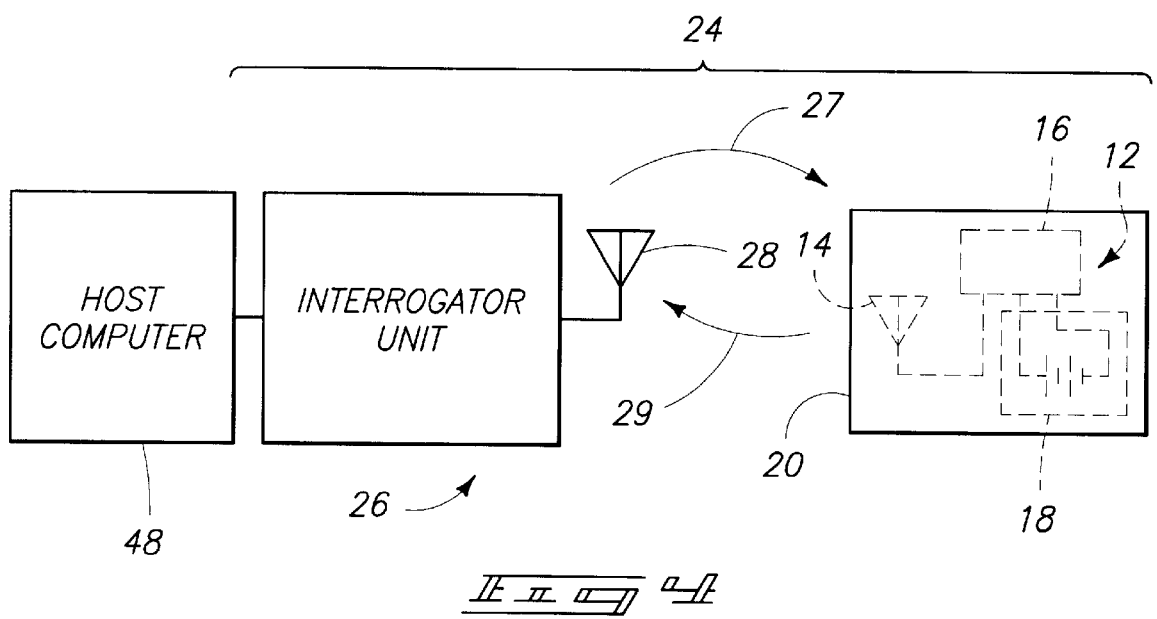

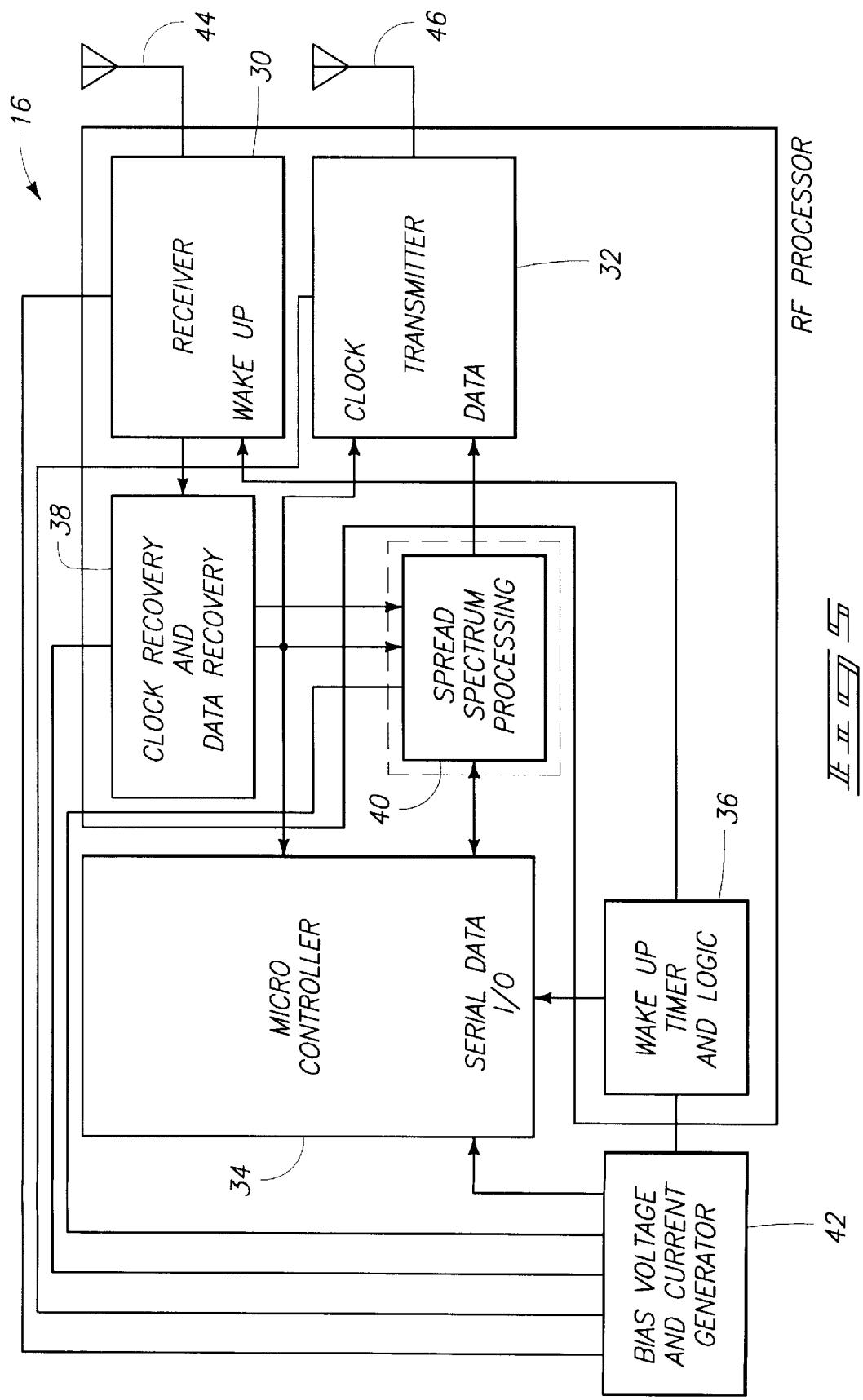

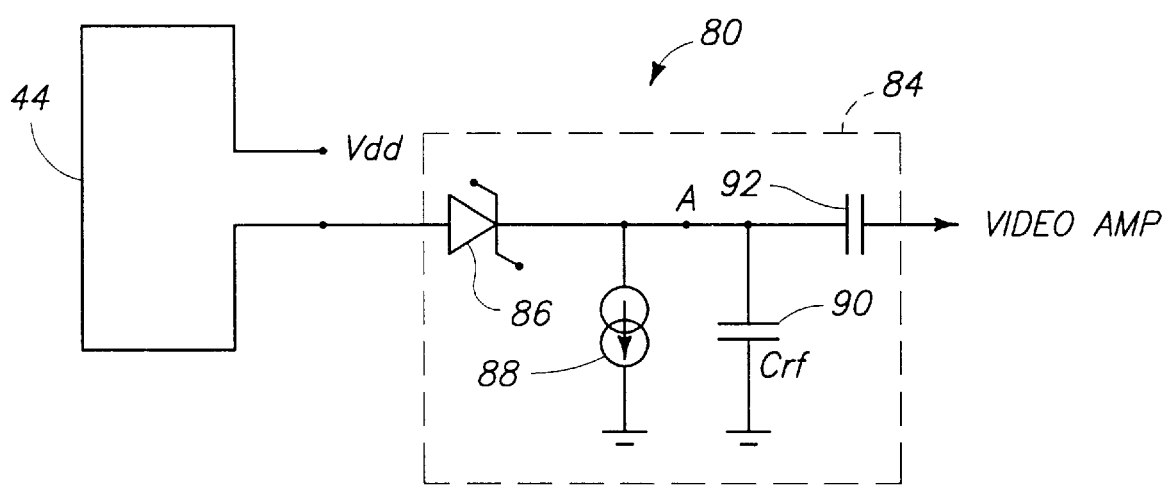

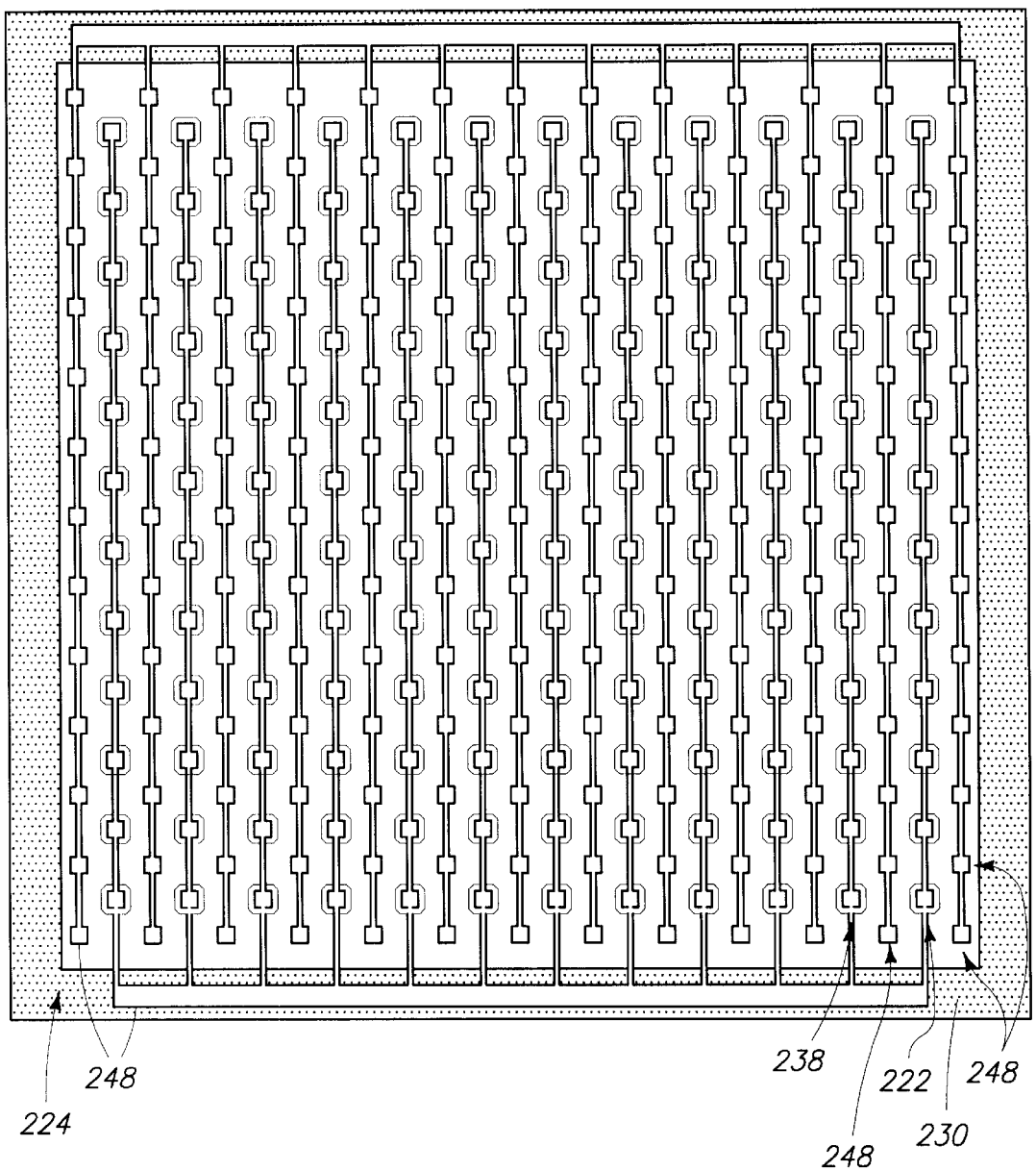

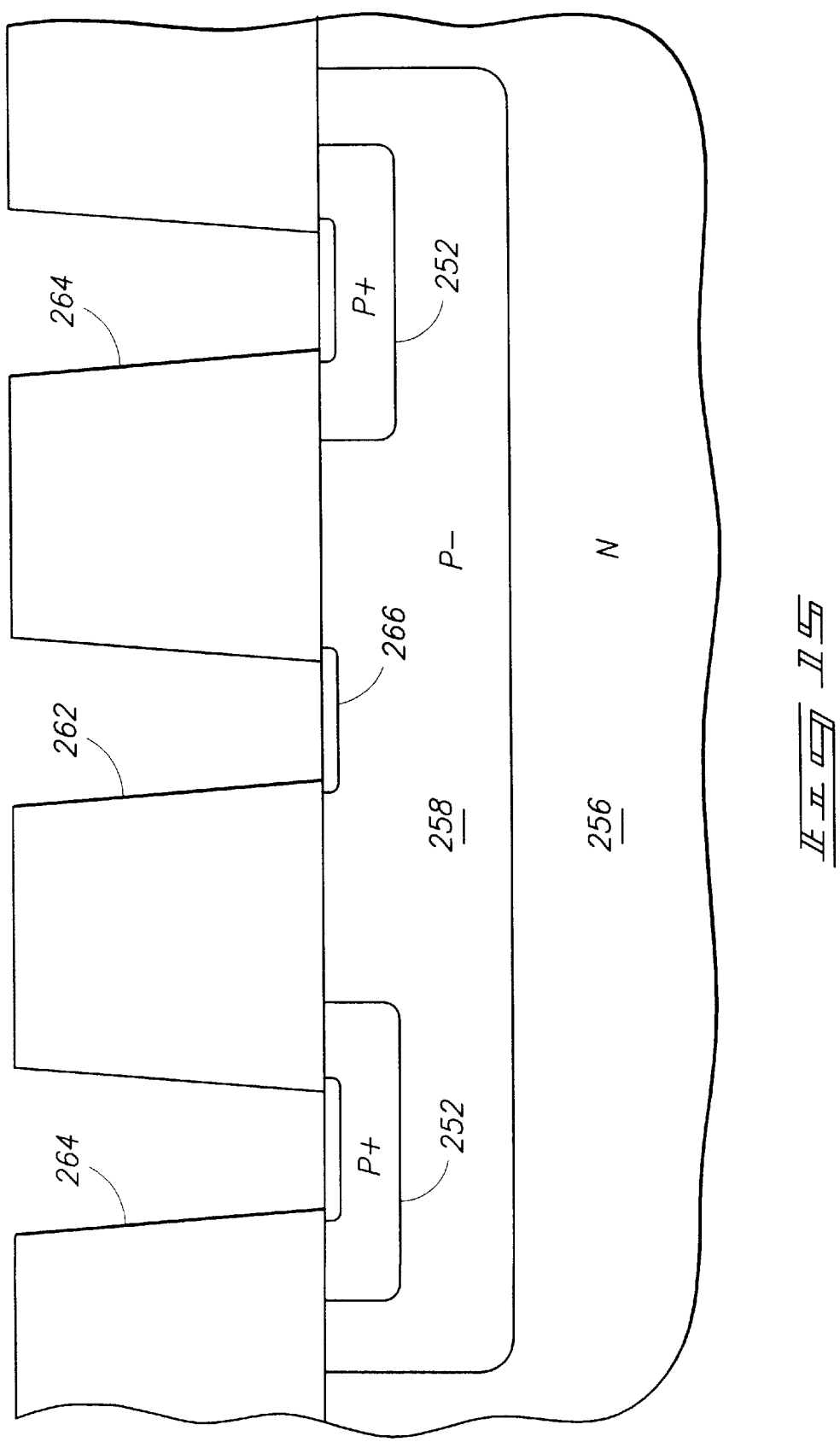

METHOD OF MAKING A SCHOTTKY DIODE IN AN INTEGRATED CIRCUIT

CROSS REFERENCE TO RELATED APPLICATIONS

This is a Division of U.S. application Ser. No. 08/705,043, filed Aug. 29, 1996, now U.S. Pat. No. 6,130,602 (incorporated herein by reference), which claims priority from U.S. Provisional Application 60/017,900, filed May 13, 1996, titled "Radio Frequency Data Communication Device."

COPYRIGHT AUTHORIZATION

A portion of the disclosure of this patent document, including the appended microfiche, contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

REFERENCE TO MICROFICHE

Appended hereto is a microfiche copy of a software guide entitled "Micron RFID Systems Developer's Guide," May 2, 1996. This appendix has 5 microfiche providing 266 total frames.

TECHNICAL FIELD

This invention relates to radio frequency communication devices. More particularly, the invention relates to radio frequency identification devices for inventory control, object monitoring, or for determining the existence, location or movement of objects. In a more specific aspect, this invention relates to method for forming Schottky diodes finding application in such radio frequency identification devices.

BACKGROUND OF THE INVENTION

As large numbers of objects are moved in inventory, product manufacturing, and merchandising operations, there is a continuous challenge to accurately monitor the location and flow of objects. Additionally, there is a continuing goal to interrogate the location of objects in an inexpensive and streamlined manner. Furthermore, there is a need for tag devices suitably configured to mount to a variety of objects including goods, items, persons, or animals, or substantially any moving or stationary and animate or inanimate object. One way of tracking objects is with an electronic identification system.

One presently available electronic identification system utilizes a magnetic field modulation system to monitor tag devices. An interrogator creates a magnetic field that becomes detuned when the tag device is passed through the magnetic field. In some cases, the tag device may be provided with a unique identification code in order to distinguish between a number of different tags. Typically, the tag devices are entirely passive (have no power supply), which results in a small and portable package. However, this identification system is only capable of distinguishing a limited number of tag devices, over a relatively short range, limited by the size of a magnetic field used to supply power to the tags and to communicate with the tags.

Another electronic identification system utilizes an RF transponder device affixed to an object to be monitored, in which an interrogator transmits an interrogation signal to the device. The device receives the signal, then generates and transmits a responsive signal. The interrogation signal and the responsive signal are typically radio-frequency (RF) signals produced by an RF transmitter circuit. Since RF signals can be transmitted over greater distances than magnetic fields, RF-based transponder devices tend to be more suitable for applications requiring tracking of a tagged device that may not be in close proximity to an interrogator. For example, RF-based transponder devices tend to be more suitable for inventory control or tracking.

BRIEF DESCRIPTION OF THE DRAWINGS

Preferred embodiments of the invention are described below with reference to the following accompanying drawings. Like names for circuit blocks indicate like components. Where there are a plurality of identical circuit blocks, detailed drawings are provided for one such circuit block. Some circuit schematics have been numbered in a hierarchial manner to reflect the hierarchial nature of these drawings. Notwithstanding the order in which the figures are numbered, note that some detailed drawings provide details to blocks included in more than one higher level drawing. Some circuit schematics have been broken up into many portions due to size requirements for patent drawings.

FIG. 3 is a front view of a radio frequency identification tag according to another embodiment of the invention.

FIG. 4 is a block diagram of an electronic identification system according to the invention and including an interrogator and the tag of FIG. 3.

FIG. 5 is a high level circuit schematic of a monolithic semiconductor integrated circuit utilized in the devices of FIGS. 1–4.

FIG. 6 is a circuit schematic illustrating a Schottky diode detector in accordance with one embodiment of the invention.

FIG. 13 is a top view illustrating a step subsequent to the step of FIG. 10 in accordance with an alternative embodiment of the invention and showing parallel connection of all Schottky diodes of a plurality of Schottky diodes.

FIG. 14 is a cross-sectional view illustrating a step of an alternative process of manufacturing a Schottky diode.

FIG. 15 is a cross-sectional view illustrating a step subsequent to the step of FIG. 14.

SUMMARY OF THE INVENTION

In one aspect, the invention provides a method of forming an integrated circuit including a Schottky diode, the method comprising: providing a p-type substrate; defining an n-type region relative to the substrate; forming an insulator over the n-type region; removing an area of the insulator for definition of a contact hole, and removing an area encircling the contact hole; forming n+regions in the n-type regions encircling the contact hole; depositing a Schottky metal in the contact hole; and annealing the metal to form a silicide interface to the n-type region.

Another aspect of the invention provides a method of forming an integrated circuit including a Schottky diode, the method comprising: providing a substrate; defining a p-type region relative to the substrate; forming an insulator over the p-type region; removing an area of the insulator for definition of a contact hole, and removing an area encircling the contact hole; forming p+regions in the p-type regions encircling the contact hole; depositing a Schottky metal in the contact hole; and annealing the Schottky metal to form a silicide interface to the p-type region.

Another aspect of the invention provides a method of forming an integrated circuit including a Schottky diode, the method comprising: providing a p-type substrate; defining an n-well region relative to the substrate; forming a BPSG insulator over the n-well region; etching away an area of the BPSG for definition of a contact hole, and etching an area encircling the contact hole; forming n+ regions in the n-well regions encircling the contact hole; depositing titanium in the contact hole; and annealing the titanium to form a silicide interface to the n-well region.

Another aspect of the invention provides a method of forming an integrated circuit including a Schottky diode, the method comprising: providing an n-type substrate; defining a p-well region relative to the substrate; forming a BPSG insulator over the p-well region; etching away an area of the BPSG for definition of a contact hole, and etching an area encircling the contact hole; forming p+ regions in the p-well regions encircling the contact hole; depositing titanium in the contact hole; and annealing the titanium to form a silicide interface to the p-well region.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Overview of Device

Figure 1:
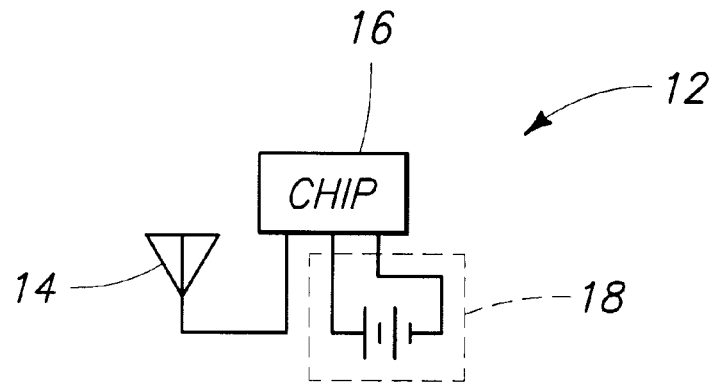
FIG. 1 is a high level circuit schematic showing a circuit embodying the invention.

FIG. 1 illustrates a radio frequency data communication device 12 embodying the invention. The radio frequency data communication device 12 includes an integrated circuit 16, a power source 18 connected to the integrated circuit 16 to supply power to the integrated circuit 16, and at least one antenna 14 connected to the integrated circuit 16 for radio frequency transmission and reception by the integrated circuit 16. For purposes of this disclosure, including the appended claims, the term "integrated circuit" shall be defined as a combination of interconnected circuit elements inseparably associated on or within a continuous substrate. For purposes of this disclosure, including the appended claims, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). For purposes of this disclosure, including the appended claims, the term "substrate" refers to any supporting structure, including, but not limited to, the semiconductive substrates described above. In the illustrated embodiment, the integrated circuit 16 is a monolithic integrated circuit. For purposes of this disclosure, including the appended claims, the term "monolithic integrated circuit" shall be defined as an integrated circuit wherein all circuit components are manufactured into or on top of a single chip of silicon. The integrated circuit 16 will be described in greater detail below. The power source 18 is a battery or other suitable power source.

Housing

The radio frequency data communication device 12 can be included in any appropriate housing or packaging.

Figure 2:
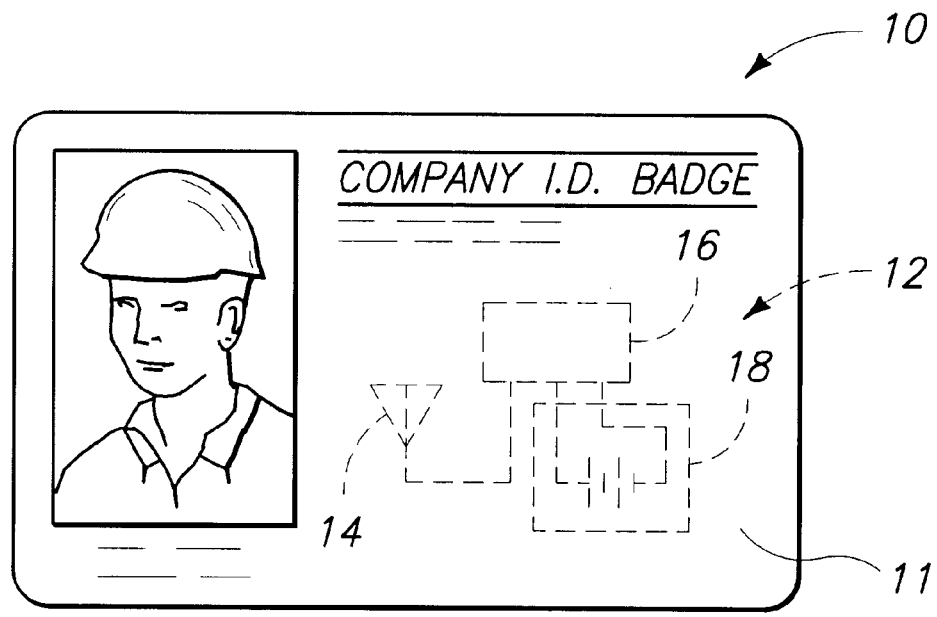
FIG. 2 is a front view of an employee badge according to but one embodiment the invention.

FIG. 2 shows but one example in the form of an employee identification badge 10 including the radio frequency data communication device 12, and a card 11 made of plastic or other suitable material. In one embodiment, the radio frequency data communication device 12 is laminated to the back face of the plastic card 11, and the card forms the visible portion of the badge. In another embodiment, the radio frequency data communication device 12 is bonded to the back face of the card by embedding it within a thin bond line of epoxy-based material. Alternatively, the radio frequency data communication device 12 is embedded into the plastic card 11. In one embodiment, the front face of the badge 10 has visual identification features including an employee photograph as well as identifying text.

FIG. 3 illustrates but one alternative housing supporting the device 12. More particularly, FIG. 3 shows a miniature housing 20 encasing the device 12 to define a tag which can be supported by an object (e.g., hung from an object, affixed to an object, etc.). The housing 20 preferably has the general shape and size, in plan view, of a postage stamp. The embodiment of FIG. 3 also includes a card 21 supporting the device 12 in the housing 20. The card 21 is formed of plastic or other suitable material having a thickness of about 0.040 inches, a width of about 1.25 inches, and a height of about 1.25 inches. In one embodiment, the device 12 is bonded to a back face of the card 21 with a thin layer of non-conductive epoxy material that cooperates with the card to define the housing 20.

Although two particular types of housings have been disclosed, the device 12 can be included in any appropriate housing. The device 12 is of a small size that lends itself to applications employing small housings, such as cards, miniature tags, etc. Larger housings can also be employed. The device 12, housed in any appropriate housing, can be supported from or attached to an object in any desired manner; for example using double sided tape, glue, lanyards, leash, nails, staples, rivets, or any other fastener. The housing can be sewn on to an object, hung from an object, implanted in an object (hidden), etc.

Antenna

Various configurations are possible for the antenna 14. The integrated circuit 16 includes a receiver 30 and a transmitter 32 (FIG. 5). In one embodiment, separate antennas 44 and 46 are provided for receiver and transmitter of the integrated circuit 16. In another embodiment (FIG. 1), a single antenna is shared by the receiver and transmitter sections. In one embodiment, the antenna is defined by conductive epoxy screened onto a card or housing. In the illustrated embodiment, the antenna is conductively bonded to the integrated circuit via bonding pads.

In an embodiment where a single antenna is employed, that single antenna preferably comprises a folded dipole antenna defining a continuous conductive path, or loop, of microstrip. Alternatively, the antenna can be constructed as a continuous loop antenna.

Battery

If the power source 18 is a battery, the battery can take any suitable form. Preferably, the battery type will be selected depending on weight, size, and life requirements for a particular application. In one embodiment, the battery 18 is a thin profile button-type cell forming a small, thin energy cell more commonly utilized in watches and small electronic devices requiring a thin profile. A conventional button-type cell has a pair of electrodes, an anode formed by one face and a cathode formed by an opposite face. Exemplary button-type cells are disclosed in several pending U.S. patent applications including U.S. patent application Ser. No. 08/205,957, "ButtonType Battery Having Bendable Construction and Angled Button-Type Battery," listing Mark E. Tuttle and Peter M. Blonsky as inventors, now U.S. Pat. No. 5,432,027; U.S. patent application Ser. No. 08/321,251, "Button-Type Batteries and Method of Forming Button-Type Batteries," listing Mark E. Tuttle as inventor, now U.S. Pat. No. 5,494,495; and U.S. patent application Ser. No. 08/348,543, "Method of Forming Button-Type Batteries and a Button-Type Battery Insulating and Sealing Gasket," listing Mark E. Tuttle as inventor, now U.S. Pat. No. 5,662,718. These patent applications and resulting patents are hereby incorporated by reference. In an alternative embodiment, the battery 18 comprises a series connected pair of button type cells. Instead of using a battery, any suitable power source can be employed.

Overview of Communication System

FIG. 4 illustrates a radio frequency communication system 24 including the device 12 and a radio frequency interrogator unit (hereinafter "interrogator") 26. The device 12 transmits and receives radio frequency communications to and from the interrogator 26. Preferably, the interrogator unit 26 includes an antenna 28, as well as dedicated transmitting and receiving circuitry, similar to that implemented on the integrated circuit 16. The system 24 further includes a host computer 48 in communication with the interrogator 26. The host computer 48 acts as a master in a master-slave relationship with the interrogator 26. The host computer 48 includes an applications program for controlling the interrogator 26 and interpreting responses, and a library ("MRL") of radio frequency identification device applications or functions. Most of the functions communicate with the interrogator 26. These functions effect radio frequency communication between the interrogator 26 and the device 12. These functions are described below in a section titled "Protocol."

One example of an interrogator implemented in combination with a transponder unit is disclosed in U.S. Pat. No. 4,857,893, hereby incorporated by reference. Generally, the interrogator 26 includes an antenna 28, and transmits an interrogation signal or command 27 ("forward link") via the antenna 28. The device 12 receives the incoming interrogation signal via its antenna 14. Upon receiving the signal 27, the device 12 responds by generating and transmitting a responsive signal or reply 29 ("return link"). Preferably, the responsive signal 29 is encoded with information that uniquely identifies, or labels the particular device 12 that is transmitting, so as to identify any object or person with which the device 12 is associated.

In the illustrated embodiment in FIG. 4, there is no communication between devices 12. Instead, the devices 12 communicate with the interrogator 26. FIG. 4 illustrates the device 12 as being in the housing 20 of FIG. 3. The system 24 would operate in a similar manner if the device 12 is provided in a housing such as the housing 10 of FIG. 2, or any other appropriate housing. Multiple devices 12 can be used in the same field of an interrogator 26 (i.e., within communications range of an interrogator 26). Similarly, multiple interrogators 26 can be in proximity to one or more of the devices 12.

Various U.S. patent applications, which are incorporated herein by reference, disclose features that are employed in various alternative embodiments of the invention: Ser. No. 08/092,147, filed Jul. 15, 1993, "Wake Up Device for a Communications System", now abandoned, and continuation application Ser. No. 08/424,827, filed Apr. 19, 1995, "Wake Up Device for a Communications System", now U.S. Pat. No. 5,790,946; Ser. No. 08/281,384, filed Jul. 27, 1994, "Communication System Having Transmitter Frequency Control", now U.S. Pat. No. 5,568,512; Ser. No. 07/990,918, filed Dec. 15, 1992, now U.S. Pat. No. 5,365,551, "Data Communication Transceiver Using Identification Protocol"; Ser. No. 07/899,777, filed Jun. 17, 1992, "Radio Frequency Identification Device (RFID) and Method of Manufacture, Including an Electrical Operating System and Method," now abandoned; Ser. No. 07/921,037, filed Jul. 24, 1992, "Anti-Theft Method for Detecting The Unauthorized Opening of Containers and Baggage," now abandoned; Ser. No. 07/928,899, filed Aug. 12, 1992, "Electrically Powered Postage Stamp or Mailing or Shipping Label Operative with Radio Frequency (RF) Communications," now abandoned; and Ser. No. 08/032,384, filed on Mar. 17, 1993, "Modulated Spread Spectrum in RF Identification Systems Method," now U.S. Pat. No. 5,539,775.

The above described system 24 is advantageous over prior art devices that utilize magnetic field effect systems because, with the system 24, a greater range can be achieved, and more information can be obtained (instead of just an identification number).

As a result, such a system 24 can be used, for example, to monitor large warehouse inventories having many unique products needing individual discrimination to determine the presence of particular items within a large lot of tagged products. The system can also be used to counteract terrorism to monitor luggage entering a plane to ensure that each item of luggage that enters the plane is owned by a passenger who actually boards the plane. Such a technique assumes that a terrorist will not board a plane that he or she is planning to bomb. The system 24 is useful whenever RF transmission over a large range is desirable, such as for inventory control. In one embodiment, the sensitivity of the devices 12 is adjustable so that only devices within a certain range of the interrogator 26 will respond. In another embodiment, the power of the interrogator 26 is adjustable so that only devices within a certain range of the interrogator 26 will respond.

However, a power conservation problem is posed by such implementations where batteries are used to supply power to the integrated circuits 16. If the integrated circuit 16 operates continuously at full power, battery life will be short, and device 12 will have to be frequently replaced. If the battery 18 is permanently sealed in a housing, replacement of the battery will be difficult or impossible. For example, one reason for sealing the battery with the integrated circuit 16 and antenna 14 in a housing is to simplify the design and construction, to reduce the cost of production, and protect the electrical interconnections between devices. Another reason is protection of the battery and integrated circuit 16 from moisture and contaminants. A third reason is to enhance the cosmetic appeal of the device 12 by eliminating the need for an access port or door otherwise necessary to insert and remove the battery. When the battery is discharged, the entire badge or stamp is then discarded. It is therefore desirable in this and other applications to incorporate power conservation techniques into the integrated circuit 16 in order to extend useful life.

In one embodiment, the devices 12 switch between a "sleep" mode of operation, and higher power modes to conserve energy and extend battery life during periods of time where no interrogation signal 27 is received by the device 12. These power conservation techniques are described in greater detail below.

In one embodiment of the invention, in order to further extend the life of the battery 18, the receiver sensitivity of the device 12 is tuned over a range of tuned and detuned states in order to modify the ability of the device to detect signal 27, and therefore adjust the tendency for the device to wake up. One way to adjust the receiver sensitivity is by adjusting the sensitivity, or impedance of the antenna. Another way is by controlling the gain of amplifiers included in the receiver. Another way is to adjust or switch in different circuit elements in the device 12, thereby realizing different circuit configurations. Additionally, the transmitting sensitivity for the device 12 can be adjusted. For example, transmitting range can be adjusted by controlling interrogator continuous wave power if the transmitter is operating in backscatter mode, and by controlling output power if the transmitter is in active mode.

Overview of Integrated Circuit

FIG. 5 is a high level circuit schematic of the integrated circuit 16 utilized in the devices of FIGS. 1–4. In the embodiment shown in FIG. 5, the integrated circuit 16 is a monolithic integrated circuit. More particularly, in the illustrated embodiment, the integrated circuit 16 comprises a single die, having a size of 209×116 mils$^2$, including the receiver 30, the transmitter 32, a micro controller or microprocessor 34, a wake up timer and logic circuit 36, a clock recovery and data recovery circuit 38, and a bias voltage and current generator 42.

In one embodiment, a spread spectrum processing circuit 40 is also included in the integrated circuit 16 and formed relative to the single die. In this embodiment, signals received by the receiver 30 are modulated spread spectrum signals. Spread spectrum modulation is described below. In the illustrated embodiment, the modulation scheme for replies sent by the transmitter 32 is selectable. One of the available selections for replies sent by the transmitter 32 is modulated spread spectrum.

CMOS Process

The integrated circuit 16 is formed according to semiconductor wafer processing steps, such as CMOS semiconductor wafer processing steps used to form static random access memories. In the preferred embodiment, the integrated circuit 16 is a single metal integrated circuit. In other words, the integrated circuit 16 is formed using a single metal layer processing method. More particularly, only one layer of metal (e.g., aluminum) is employed. This is advantageous in that it results in a lower cost of production.

In this processing method, a p-type wafer is employed. The processing method employed provides n-well areas used to define p-channel transistors; an active area which is used to define p+ and n+ diffused regions inside the p-type wafer or inside the n-well areas. Next, a layer is provided that helps prevent leakage between adjacent devices. Then, transistor are defined by forming n-type and p-type polysilicon. Then, a contact layer is defined for connecting desired intersections of polysilicon with metal (aluminum) that is subsequently formed. The contact layer is also used, in some instances, for connecting desired intersections of the metal that is subsequently formed with active area. Then the metal layer is formed. The contact layer provides a means for connecting metal with layers below the metal. Then, a passivation step is performed. Passivation means that the die is covered with a protective layer and holes are cut around the edge of the die so that electrical connection can be made to the bond pads.

In some processing, after the metal layer is formed, an insulating layer is provided, and another layer of aluminum is formed above the insulating layer. Holes are provided at selected locations to interconnect the top layer of aluminum with lower layers. An advantage of using multiple layers of metal is that it provides greater flexibility in how functional blocks are laid out and in how power is bused to various areas. However, multiple metal layers add processing steps. This results in added cost and complexity.

The process of the preferred embodiment employs only one layer of metal, and is therefore a relatively simple, inexpensive process.

The following U.S. patents, which are incorporated herein by reference, disclose CMOS processing techniques that are employed in various alternative embodiments of the invention: U.S. Pat. No. 5,489,546 to Ahmad et al.; U.S. Pat. No. 5,272,367 to Dennison et al.; and U.S. Pat. No. 5,134,085 to Gilgen et al.

Various other processing methods can be employed in alternative embodiments.

Transmitter and Receiver

The receiver 30 is a radio frequency receiver included in the integrated circuit 16, and the transmitter 32 is a radio frequency transmitter included in the integrated circuit 16. In one embodiment, the receiver 30 includes a Schottky diode detector. Various forms of Schottky diode detectors are described in a paper titled "Designing Detectors for RF/ID Tags," by Raymond W. Waugh of Hewlett-Packard Company, submitted for presentation at the RF Expo, San Diego, Feb. 1, 1995, and incorporated herein by reference.

The receiver 30 of the illustrated embodiment makes use of the rate or frequency of data included in incoming signals, but does not make use of the carrier frequency of the incoming signal. In other words, operation of the receiver 30 is independent of the frequency of the carrier of the incoming signal over a wide range of carrier frequencies.

Therefore, the device 12 can operate over a wide range of carrier frequencies. For example, the device 12 can operate with carriers of 915–5800 MHZ. In a more particular embodiment, the device 12 can operate with carrier frequencies in the 915, 2450, or 5800 MHZ bands. In the illustrated embodiment, the antennas are half wave antennas, and frequency selectivity of the device 12 is achieved based on selection of the antenna external to the integrated circuit 16. Capacitors employed in the Schottky diode detector are also selected based on the carrier frequency that will be employed.

Schottky Diode RFID Detector

Overview

For purposes of realizing a cost effective and low power radio frequency receiver on an RFID tag, a simple Schottky diode receiver is utilized. The receiver is formed from a Schottky diode detector, an amplifier, and the receiving antenna["rxantenna"]. With the implementation of a single integrated circuit 16 RFID tag, an easy and low cost technique for configuring the frequency of operation on a tag is needed. Receiver frequency characteristics can be tailored by selecting an appropriately sized antenna to be coupled to the integrated circuit 16 that supports the Schottky diode detector. Furthermore, adjustment of bias current across the Schottky diode can be used to realize a desired resistance there across, enabling tuning or detuning of the receiver.

For purposes of enabling simplified representation, FIG. 6 illustrates a simplified circuit schematic for one embodiment of a receiver 80 having a Schottky diode detector 84 and antenna 44.

The detector 84 includes a Schottky diode 86 having an anode connected to the antenna 44 and having a cathode.

The exemplary antenna 44 is formed from a loop or folded dipole construction. The antenna 44 performs band pass filtering.

The detector 84 further includes an ideal current source 88 connected to the cathode of the Schottky diode 86 and driving current through the antenna and Schottky diode 86 in the direction from the anode to the cathode. The current source 88 is an ideal current source, and is configured to forward bias the Schottky diode 86, realizing a desired resistance (or impedance) in the process.

The detector 84 further includes a capacitor 90 connected between the cathode of the Schottky diode 86 and ground. The capacitor 90 provides a radio frequency short to ground so that all radio frequency voltage appears across the Schottky diode 86. This maximizes a base band signal produced by the Schottky diode 86.

The detector 84 further includes a capacitor 92 having a first terminal connected to the cathode and having a second terminal defining an output of the detector 84. The capacitor 92 provides an AC short to video frequency, and defines the output of the detector 84. The capacitor 92 allows different bias levels in the detector and at the input of a video amplifier connected to the output of the detector 84.

Integrated Circuit Implementation

A Schottky diode detector is configured within a receiver to receive radio frequency signals via a receiving antenna. In operation, the Schottky diode detector and the receiving antenna cooperate to form a tunable receiving circuit. Signals detected by the Schottky diode detector are input to a five stage amplifier, then a comparator, for further signal conditioning. The output of the comparator is a digital representation of the received baseband signal.

Each Schottky diode is formed from an array of Schottky diodes. In order to use standard contact hole sizes, each Schottky diode is formed from an array of Schottky diodes connected together in parallel to act as a single Schottky diode.

Details of Method of Forming an IC Schottky Structure

A method of forming a Schottky structure that can be employed to manufacture the Schottky diode detector will now be described. A Schottky diode is a diode in which a metal and a semiconductor form a pn junction. Electrons injected into the metal have a higher energy level than the charge carriers in a semiconductor, and energy storage at the junction is low because current flow is not accompanied by hole movement.

Figure 11:
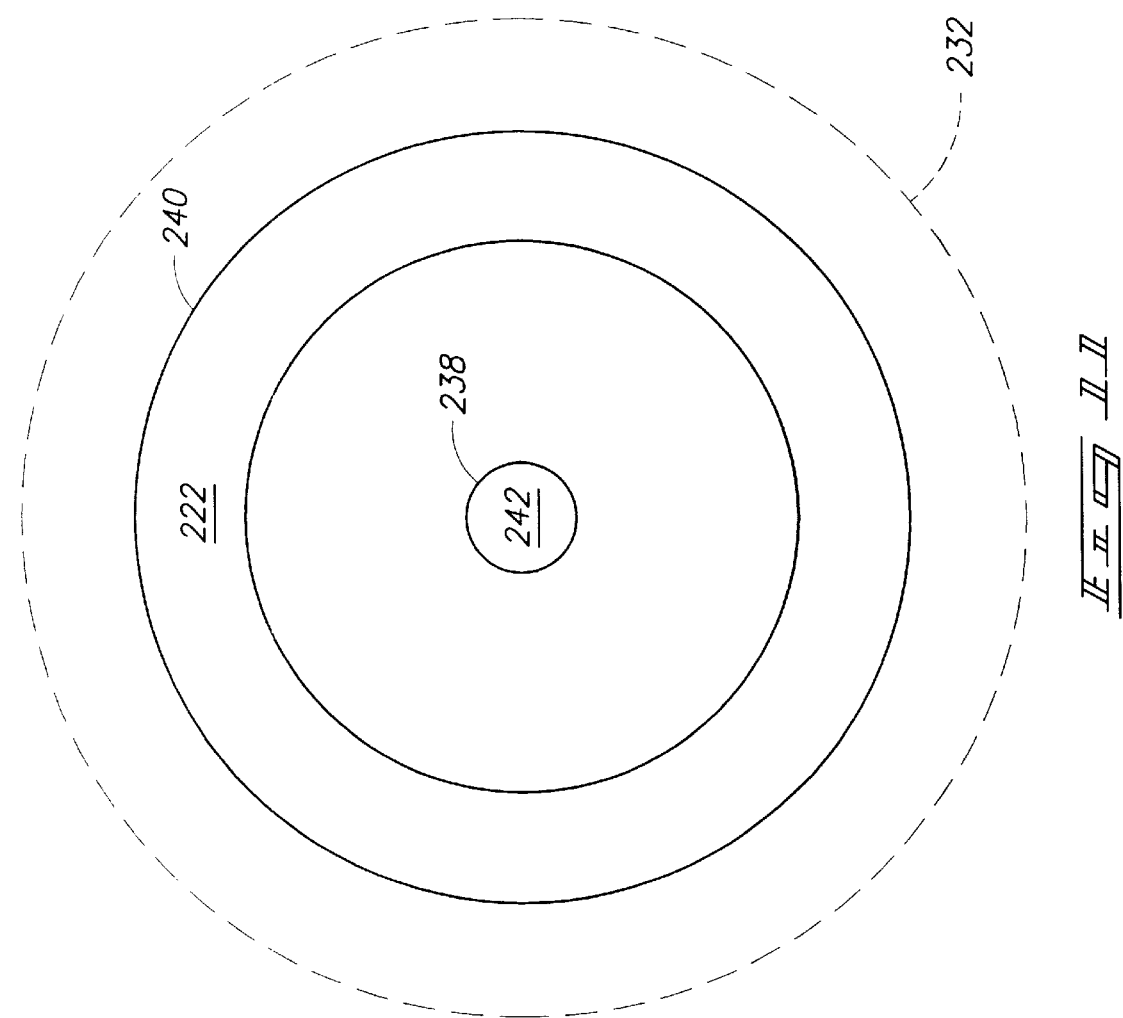
FIG. 11 is an exemplary top plan view of one embodiment of the Schottky diode of FIG. 9.
Figure 12:
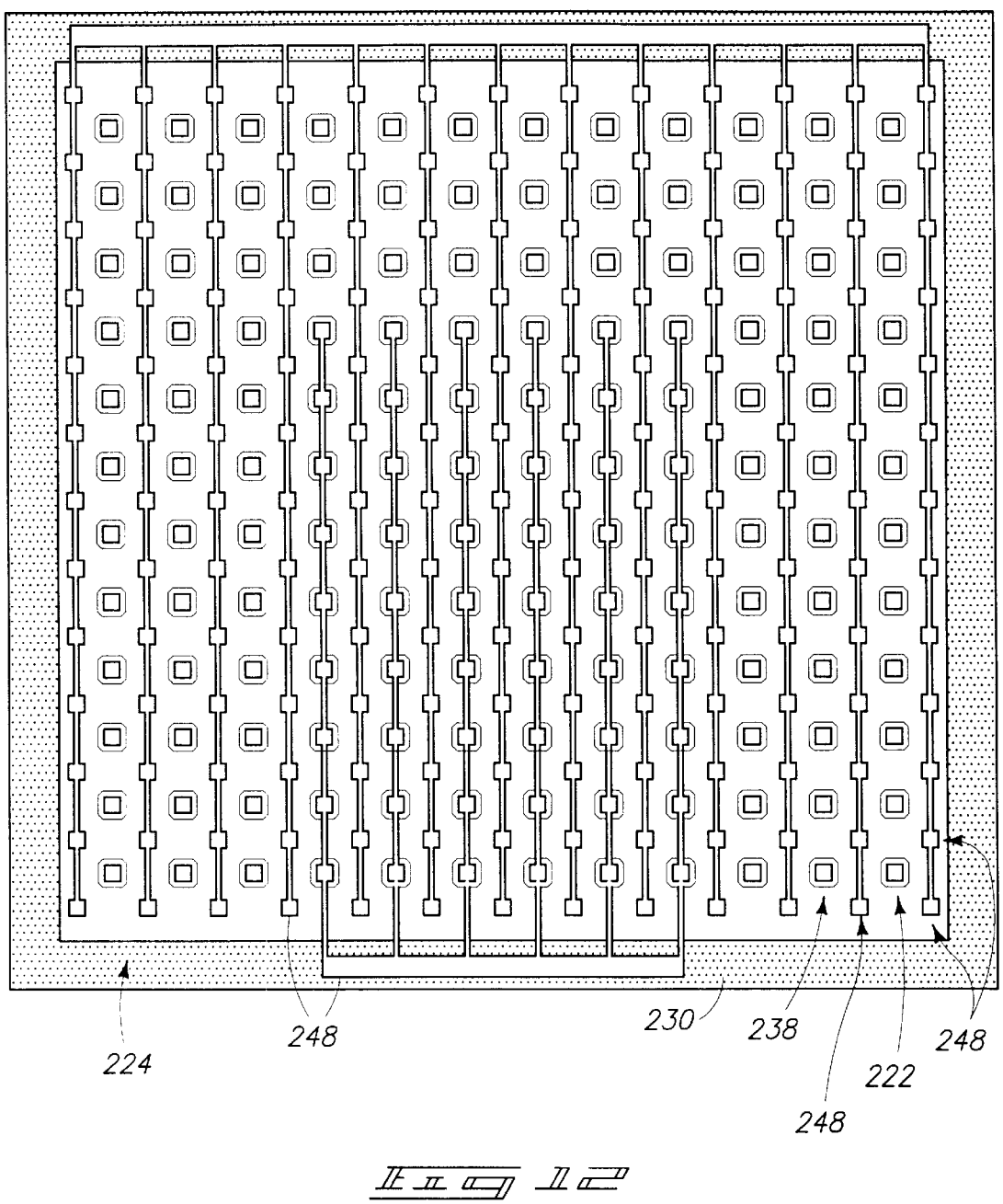
FIG. 12 is a top view illustrating a step subsequent to the step of FIG. 10 and showing parallel connection of some Schottky diodes of a plurality of Schottky diodes.
Figure 11:
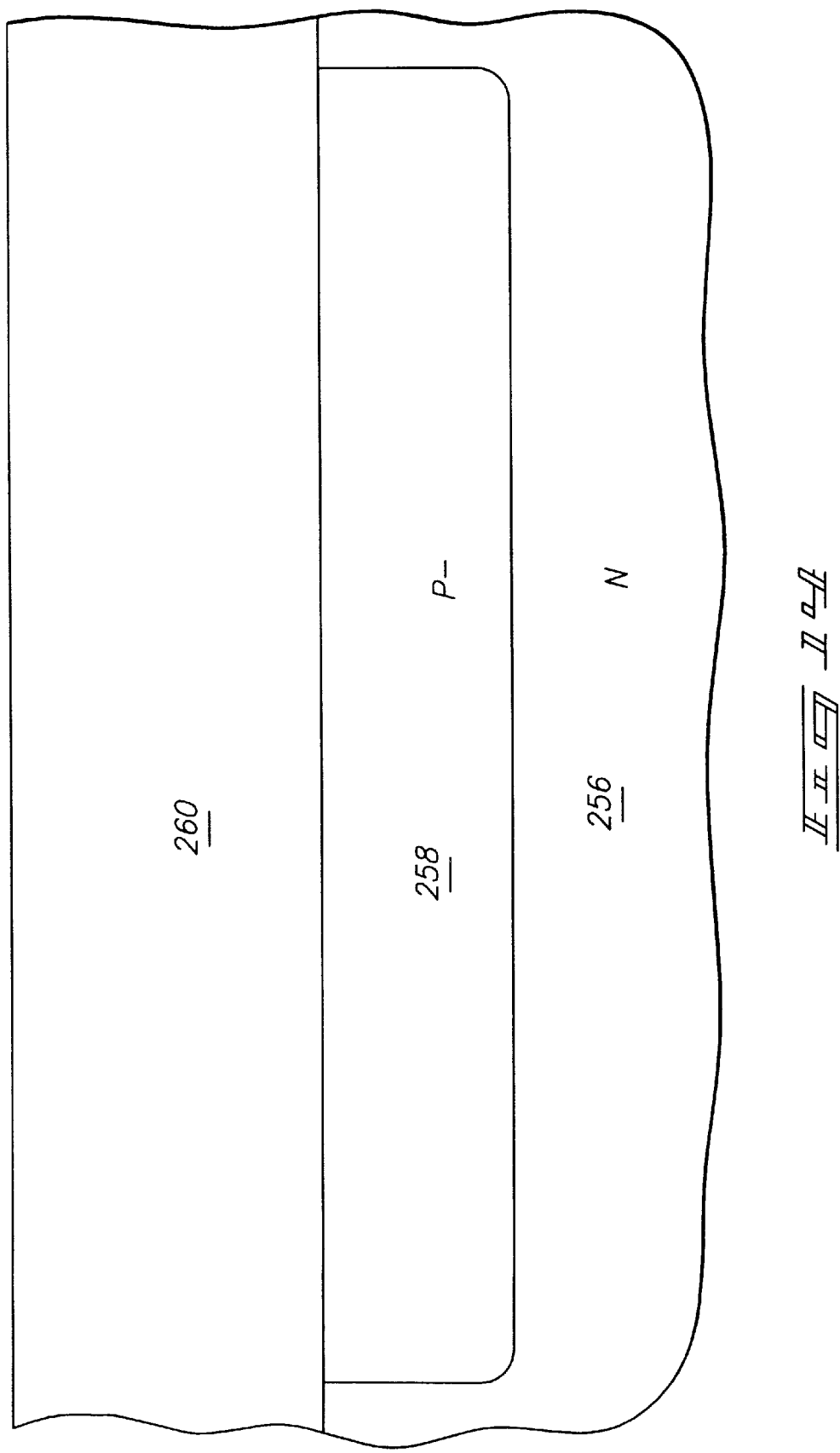

One embodiment of the invention comprises a Schottky diode 220 including an n+ region 222 generally encircling or surrounding an n-well region 224 (FIG. 11). In the illustrated embodiment, the n+ region 222 is heavily doped; e.g., $1 \times 10^{18}$ atoms/cm$^3$ or greater of n-type material, and the n-well region 224 is lightly doped; e.g., $1 \times 10^{17}$ atoms/cm$^3$ or lower of n-type material. The n-well region 224 defines a contact area 226, and the n+ region 222 provides a low resistance interconnect to the Schottky diode 220. The n+ region 222 has a diffused edge 228, and the n-well region has a contact edge 230. The distance from the n+ region diffused edge 228 to the n-well region contact edge 230 is minimized. In one embodiment, the distance from the n+ region diffused edge 228 to the n-well region contact edge 230 is less than twenty micrometers. In a more preferred embodiment, the distance from the n+ region diffused edge 228 to the n-well region contact edge 230 is about two micrometers. More particularly, the integrated circuit 16 includes a grid pattern of n+ regions 222. Each region 222 generally encircles or surrounds isolated n-well regions 224 of a large common n-well region 232 under the n+ regions 222 (FIGS. 11 and 12). This provides for parallel connection of a selectable number of Schottky diodes 220. As described elsewhere, the parallel connection of Schottky diodes 220 acts a single Schottky diode, and allows use of standard sized contact holes. The number of Schottky diodes 220 connected together is selectable to tailor resistance, parasitic capacitance, and electrostatic discharge sensitivity for a specific application.

To form the grid of Schottky diodes 220, the following process steps are performed.

Figure 7:
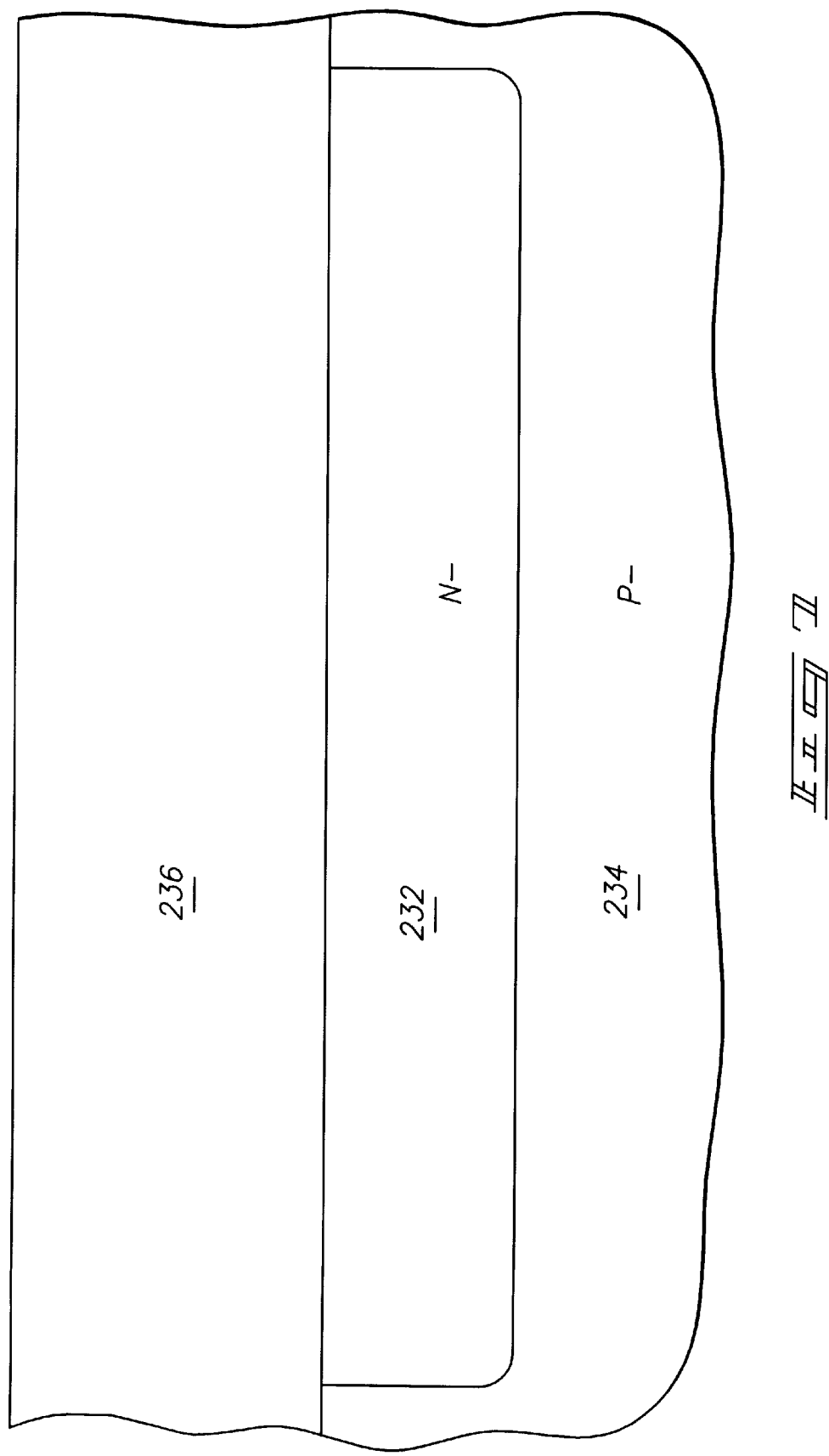
FIG. 7 is a cross-sectional view illustrating a step of a process of manufacturing a Schottky diode.

First, a p-substrate 234 is provided (FIG. 7). Next, n-well region 232 is defined relative the substrate 234. Next, an insulator 236 is formed over the n-well region. In one embodiment, the insulator 236 is borophosphosilicate glass (BPSG).

Figure 8B:
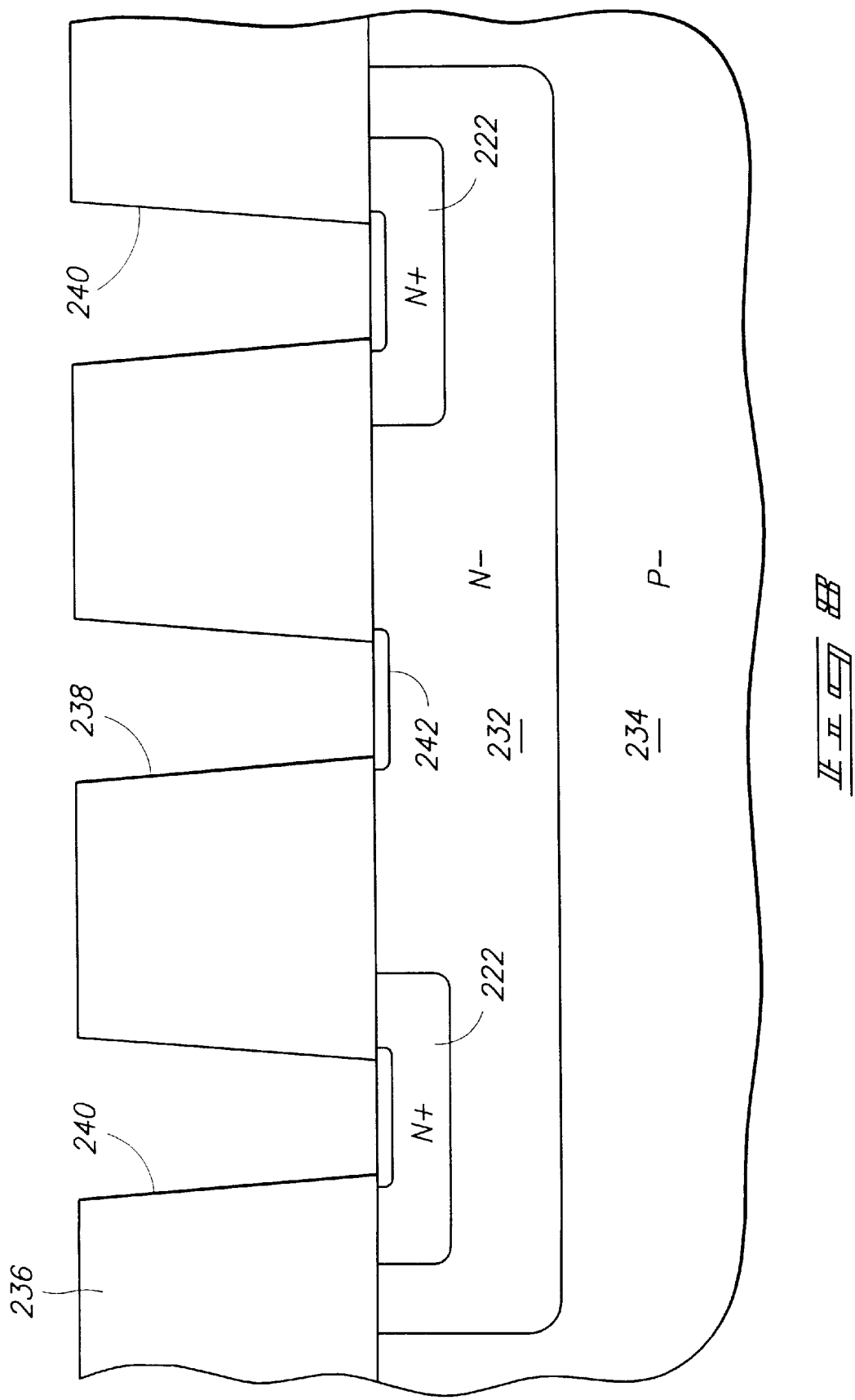
FIG. 8 is a cross-sectional view illustrating a step subsequent to the step of FIG. 7.

Next, a removal or etching step is performed to remove areas of the insulator 236 for definition of contact holes 238, and areas 240 generally encircling or surrounding the contact holes 238 (FIG. 8). The contact holes 238 are not necessarily circular in cross-section; any cross-sectional shape is possible. Similarly, any cross-sectional shape is possible for the areas 240 surrounding the contact holes 238. In a preferred embodiment, the contact holes 238 all have the same diameter (or peripheral extent) to facilitate subsequent filling of the contact holes 238 (described below in greater detail). In an alternative embodiment, different contact holes 238 have different sizes. In the process of the illustrated embodiment, the contact holes 238 do not need to be completely filled with a conductor, and all contact holes therefore do not need to be the same size.

In the illustrated embodiment, the n+ regions 222 are formed in the n-well region 232 by diffusion after the etching has been performed, via the openings 240 surrounding the contact holes 238. The n+ regions 222 can be formed by other processes or in other sequences. For example, the n+ regions 222 can be formed before the insulator 236 is formed over the n-well region 232.

Next, a Schottky forming metal 242 such as titanium is formed in the contact hole openings. In the illustrated embodiment, the Schottky forming metal is deposited on the surface of n-well regions 224 via the contact hole openings 238. In one embodiment, the thickness of the deposited metal is about 200 Å. The metal is annealed to form a stable silicide interface to the n-well silicon.

Figure 9:
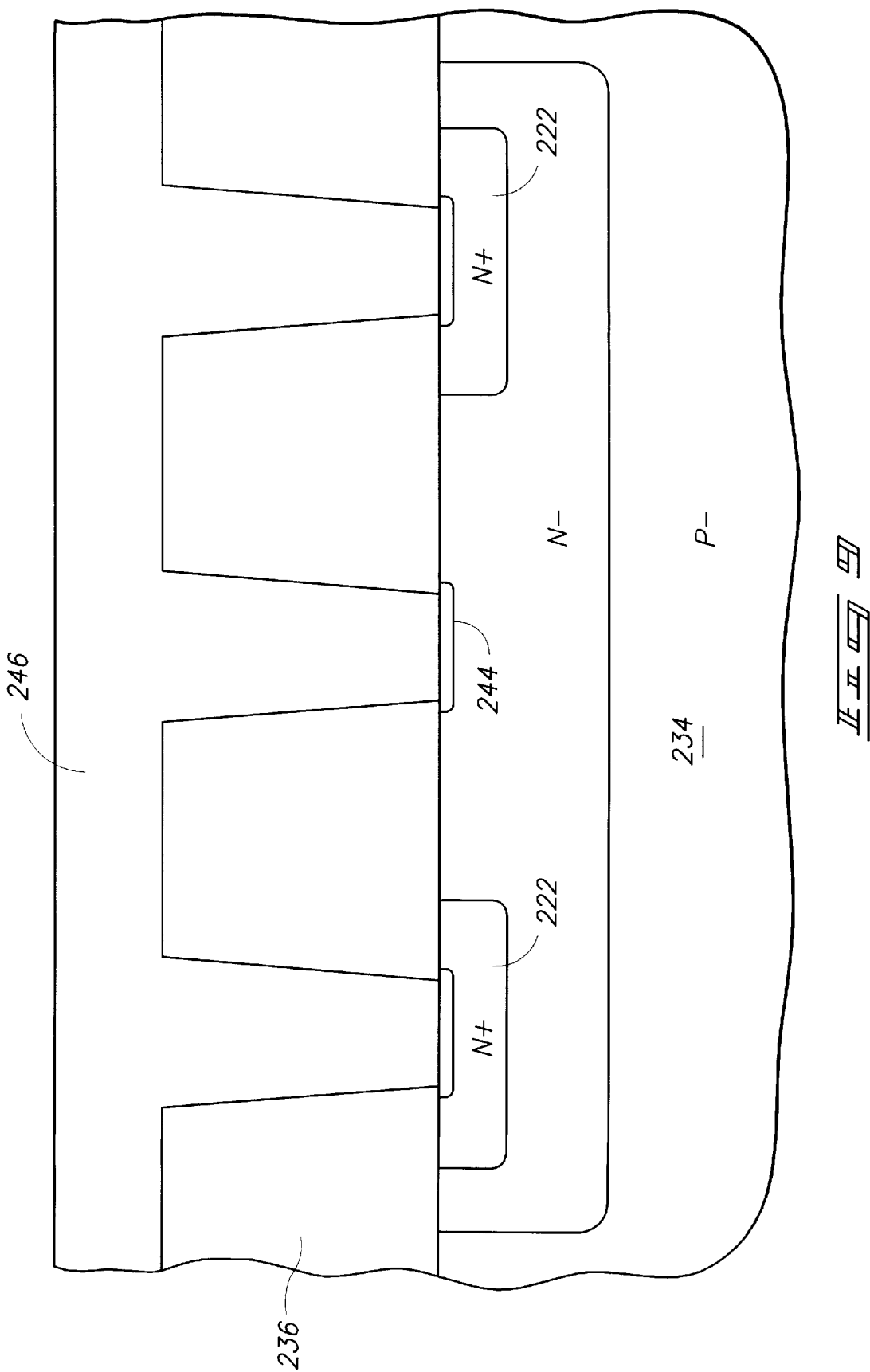
FIG. 9 is a cross-sectional view illustrating a step subsequent to the step of FIG. 8.
Figure 10:
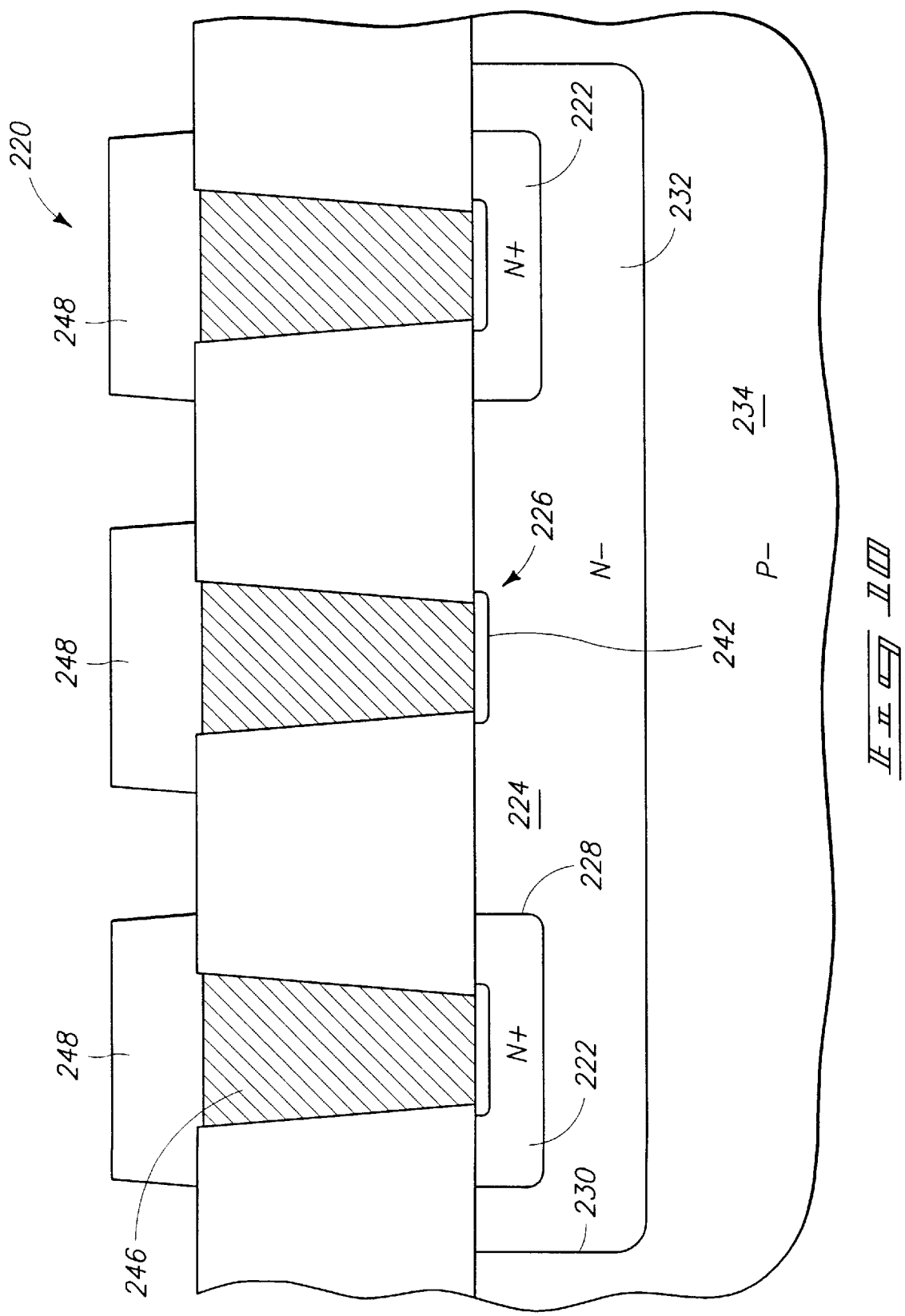
FIG. 10 is a cross-sectional view illustrating a step subsequent to the step of FIG. 9.

If it is desired to fill the contact holes, a material such as tungsten 246 may be deposited into the contact holes (FIG. 9). The tungsten is then planarized to form final contact structures (FIG. 10).

Then, an interconnect metallization step is performed (FIG. 12). For example, copper doped aluminum 248 is deposited (e.g. sputtered) over the wafer, then the wafer is masked and etched to remove unwanted areas. The mask defines a pattern to interconnect the contacts as desired.

A variable number of Schottky diodes may be connected in parallel by simply changing the metal masks and interconnecting only the number of Schottky diodes required by a particular circuit application. In one illustrated embodiment, an array of twelve by twelve Schottky diodes (144 total Schottky diodes) is provided (FIG. 13). In another embodiment (FIG. 12), less than all available Schottky diodes are connected together. In one embodiment, only a six by six array (36 Schottky diodes) is connected together in parallel.

In one alternative embodiment, aluminum is employed instead of tungsten and silicide. In another alternative embodiment, tungsten is employed instead of aluminum to interconnect contacts, and the step of forming tungsten plugs is omitted.

In an alternative embodiment (FIG. 17), each Schottky diode includes a p+ region 252 encircling a "p-" p-well region 254 and is formed by a method substantially identical to the method described above except with p-type material substituted for n-type material and vice versa. More particularly, in this alternative embodiment, the following steps are performed.

First, an n-type substrate 256 is provided (FIG. 14. Next, a common p-well region 258 is defined relative the substrate 256. The common p-well region 258 defines the p-well regions 254 for each of the Schottky diodes. Next, an insulator 260 such as borophosphosilicate glass (BPSG) is formed over the p-well region 258. Next, an etching step is performed to etch away regions of the insulator for definition of contact holes, and areas 264 generally encircling or surrounding the contact holes (FIG. 15). In a preferred embodiment, the contact holes 262 all have the same diameter (or peripheral extent) to facilitate subsequent filling of the contact holes 262 with Tungsten or another conductor. In an alternative embodiment, different contact holes 262 have d different diameters. In the process of the illustrated embodiment, the contact holes do not need to be completely filled, and all contact holes therefore do not need to be the same size.

In the illustrated embodiment, the p+ regions 252 are formed in the p-well regions by diffusion after the etching has been performed, via the openings 264 encircling the contact holes. The p+ regions 252 can be formed by other processes or at other times. For example, the p+ regions 252 can be formed before the insulator is formed over the p-well regio n 258.

Next, a Schottky forming metal 266 such as Titanium is formed in the contact hole openings 262. In the illustrated embodiment, the Schottky forming metal 266 is deposited on the surface of the p-well region 258 via the contact hole openings 262. In one embodiment, the thickness of the deposited metal is about 200 Å. The metal 266 is annealed to form a stable silicide interface 268 to the p-well region 258.

Figure 16:
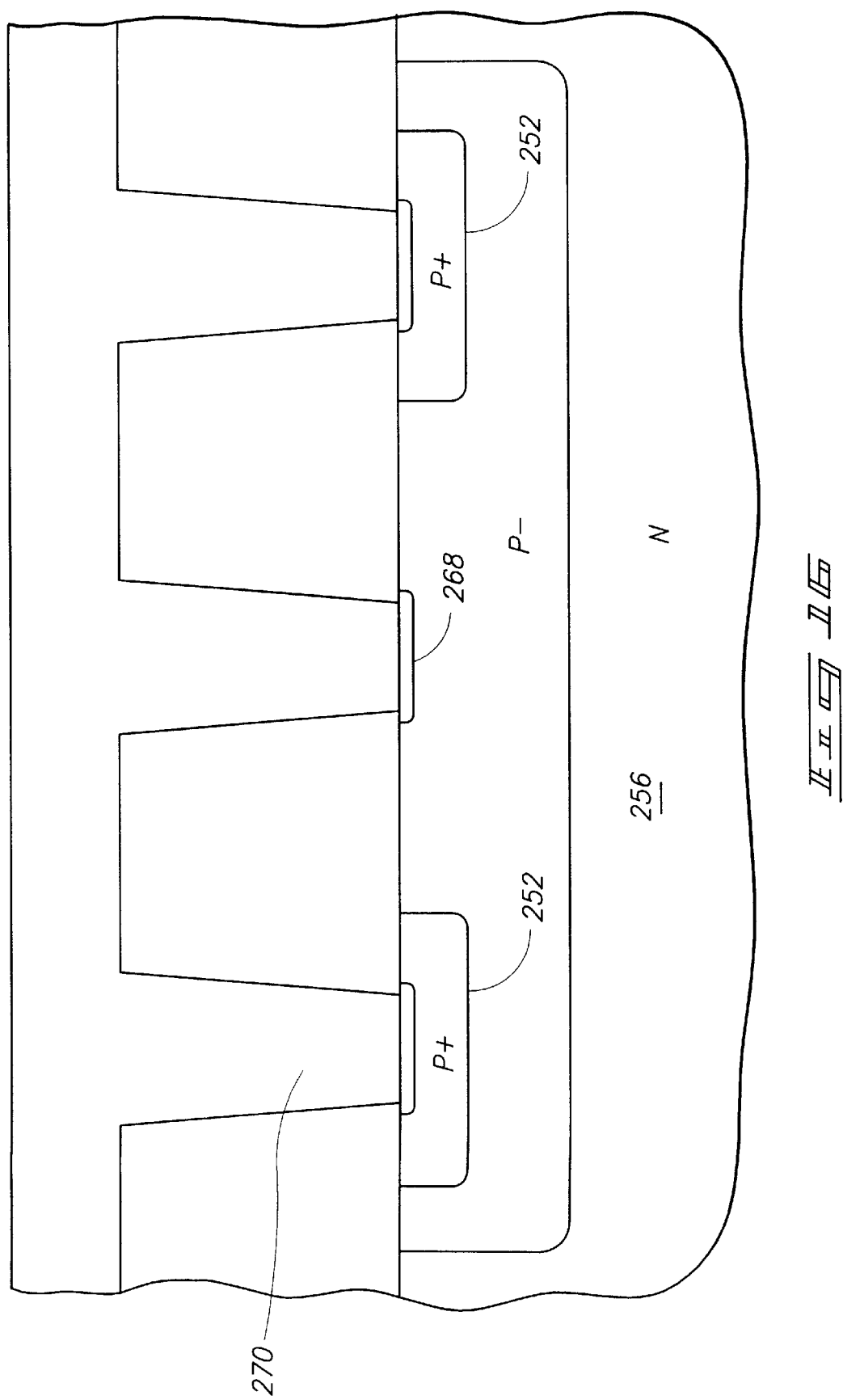
FIG. 16 is a cross-sectional view illustrating a step subsequent to the step of FIG. 15.

If it is desired to fill the contact holes 262, a metal such as tungsten 270 is deposited into the contact holes (FIG. 16). The tungsten 270 is then planarized to form final contact structures.

Figure 17:
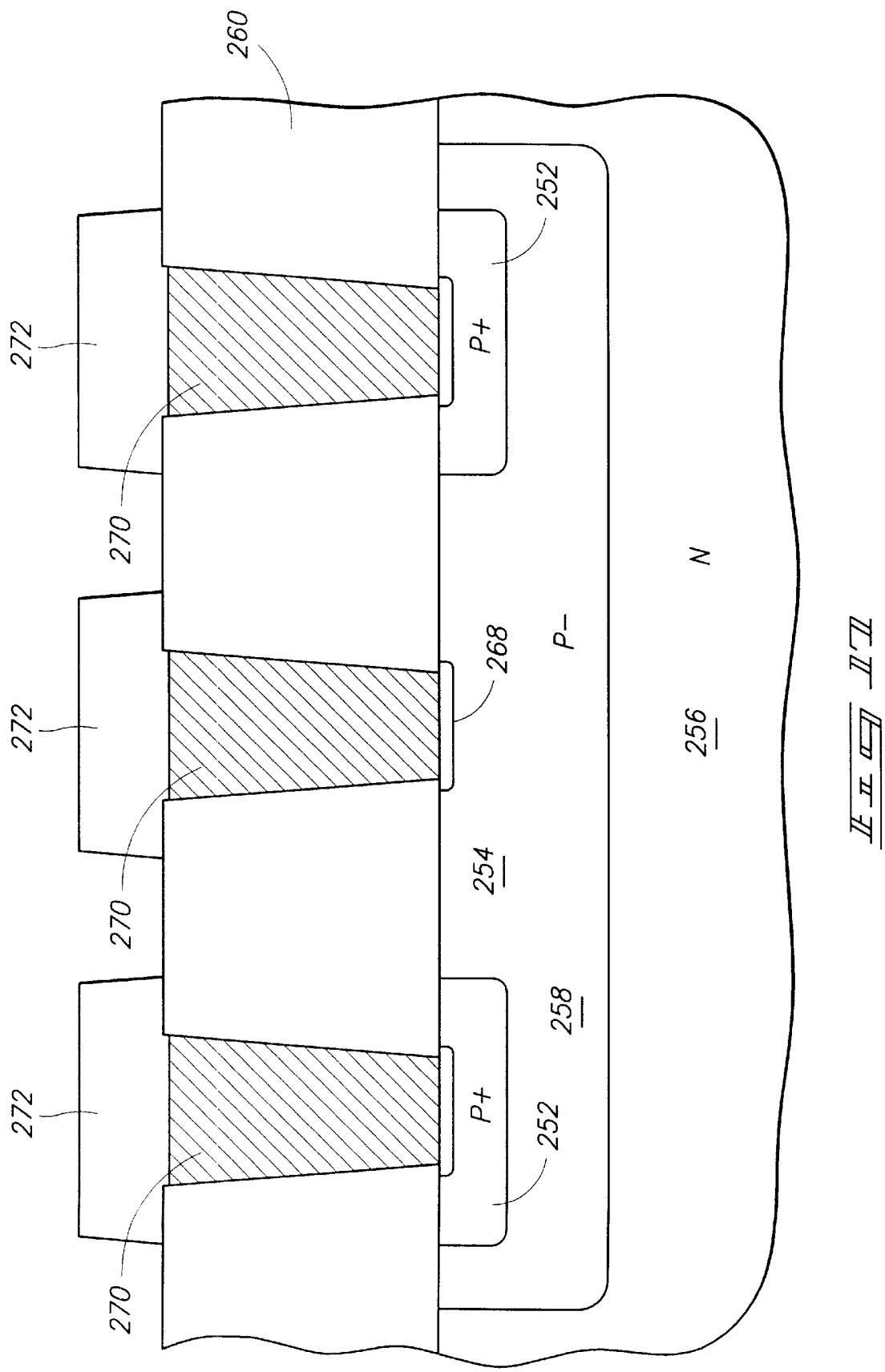
FIG. 17 is a cross-sectional view illustrating a step subsequent to the step of FIG. 16.

Then, an interconnect metallization step is performed (FIG. 17). For example, copper doped aluminum 272 is deposited (e.g. sputtered) over the wafer, then the wafer is masked and etched to remove unwanted areas. The mask defines a pattern to interconnect the contacts as desired.

The above described processes for forming a Schottky diode are preferred d over a process wherein, after the contact holes a etched, ion implantation of phosphorus into the holes is performed. In such a process, the implant would be a two step process, with a low energy implant (e.g., 35 keV of $4\times10^{12}$ ions/cm$^2$) followed by a high energy implant (e.g., 120 keV of $4\times10_{12}$ ions/cm$^2$). Such implants cause a high doping level at the bottom of the contact hole, which prevents formation of a low leakage Schottky diode. The preferred processes described above eliminates these two contact implants, and allows for formation of a good quality Schottky diode.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an integrated circuit including a Schottky diode, the method comprising:

providing a p-type substrate;

defining an n-type region relative to the substrate;

forming an insulator over the n-type region;

removing an area of the insulator for definition of a contact hole, and removing an area encircling the contact hole;

forming n+ regions in the n-type regions encircling the contact hole;

depositing a Schottky metal in the contact hole; and annealing the metal to form a silicide interface to the n-type region.

2. A method in accordance with claim 1 and further comprising depositing tungsten into the contact hole.

3. A method in accordance with claim 2 wherein the tungsten is deposited by chemical vapor deposition.

4. A method in accordance with claim 2 and further comprising planarizing the tungsten.

5. A method of forming an integrated circuit including a Schottky diode, the method comprising:

providing a substrate;

defining a p-type region relative to the substrate;

forming an insulator over the p-type region;

removing an area of the insulator for definition of a contact hole, and removing an area encircling the contact hole;

forming p+ regions in the p-type regions encircling the contact hole;

depositing a Schottky metal in the contact hole; and annealing the Schottky metal to form a silicide interface to the p-type region.

6. A method in accordance with claim 5 and further comprising depositing tungsten into the contact hole.

7. A method in accordance with claim 6 wherein the tungsten is deposited by chemical vapor deposition.

8. A method in accordance with claim 6 and further comprising planarizing the tungsten.

9. A method of forming an integrated circuit including a Schottky diode, the method comprising:

providing a p-type substrate;

defining an n-well region relative to the substrate;

forming a BPSG insulator over the n-well region;

etching away an area of the BPSG for definition of a contact hole, and etching an area encircling the contact hole;

forming n+ regions in the n-well regions encircling the contact hole;

depositing titanium in the contact hole; and annealing the titanium to form a silicide interface to the n-well region.

10. A method in accordance with claim 9 and further comprising depositing tungsten into the contact hole.

11. A method in accordance with claim 10 wherein the tungsten is deposited by chemical vapor deposition.

12. A method in accordance with claim 10 and further comprising planarizing the tungsten.

13. A method of forming an integrated circuit including a Schottky diode, the method comprising:

providing an n-type substrate;

defining a p-well region relative to the substrate;

forming a BPSG insulator over the p-well region;

etching away an area of the BPSG for definition of a contact hole, and etching an area encircling the contact hole;

forming p+ regions in the p-well regions encircling the contact hole;

depositing titanium in the contact hole; and annealing the titanium to form a silicide interface to the p-well region.

14. A method in accordance with claim 13 and further comprising depositing tungsten into the contact hole.

15. A method in accordance with claim 14 wherein the tungsten is deposited by chemical vapor deposition.

16. A method in accordance with claim 14 and further comprising planarizing the tungsten.

17. A method of forming an integrated circuit including a Schottky diode, the method comprising:

providing a substrate of a first conductivity type;

defining a region of a second conductivity type relative to the substrate;

forming an insulator over the second conductivity type region;

removing an area of the insulator for definition of a contact hole, and removing an area encircling the contact hole;

forming highly doped regions of the second conductivity type in second conductivity type regions encircling the contact hole;

depositing a Schottky metal in the contact hole; and annealing the metal to form a silicide interface to the second conductivity type region.

18. A method in accordance with claim 17 wherein forming an insulator comprises forming a BPSG insulator.

19. A method in accordance with claim 17 and further comprising depositing tungsten into the contact hole.

20. A method in accordance with claim 17 wherein the tungsten is deposited by chemical vapor deposition.

21. A method in accordance with claim 18 and further comprising planarizing the tungsten.

22. A method of forming an integrated circuit including a Schottky diode, the method comprising:

providing a n-type substrate;

defining a p-type region relative to the n-type substrate;

forming an insulator over the p-type region;

removing an area of the insulator for definition of a contact hole, and removing an area encircling the contact hole;

forming p+ regions in the p-type regions encircling the contact hole;

depositing a Schottky metal in the contact hole; and annealing the Schottky metal to form a silicide interface to the p-type region.

23. A method in accordance with claim 22 and further comprising depositing tungsten into the contact hole.

24. A method in accordance with claim 23 wherein the tungsten is deposited by chemical vapor deposition.

25. A method in accordance with claim 23 and further comprising planarizing the tungsten.

* * * * *

UNITED STATES PATENT AND TRADEMARK OFFICE
CERTIFICATE OF CORRECTION

PATENT NO.     : 6,492,192 B1
DATED          : December 10, 2002
INVENTOR(S)    : James E. O'Toole et al.

It is certified that error appears in the above-identified patent and that said Letters Patent is hereby corrected as shown below:

Title page,
Item [57], ABSTRACT,
Line 12, replace "to form a suicide interface to the second conductivity type" with -- to form a silicide interface to the second conductivity type --

Column 2,
Line 29, Fig. 2, replace "but one embodiment the invention." with -- but one embodiment of the invention. --

Column 8,
Line 11, replace "transistor are defined by forming n-type and p-type" with -- transistors are defined by forming n-type and p-type --

Column 11,
Line 41, replace "First, an n-type substrate 256 is provided (FIG.14. Next," with -- First, an n-type substrate 256 is provided (FIG.14). Next, --
Line 55, replace "d different diameters. In the process of the illustrated" with -- different diameters. In the process of the illustrated --
Line 65, replace "regio n 258." with -- region 258. --

Column 12,
Line 17, replace "diode are preferred d over a process wherein, after the" with -- diode are preferred over a process wherein, after the --
Line 18, replace "contact holes a etched, ion implantation of phosphorus into" with -- contact holes are etched, ion implantation of phosphorus into --

Signed and Sealed this

Thirteenth Day of May, 2003

JAMES E. ROGAN
*Director of the United States Patent and Trademark Office*